United States Patent
Furukawa et al.

(10) Patent No.: US 6,744,830 B1
(45) Date of Patent: Jun. 1, 2004

(54) DIGITAL BROADCASTING SIGNAL RECEIVER

(75) Inventors: Hitonobu Furukawa, Osaka (JP); Hiroaki Ozeki, Osaka (JP); Masami Takigawa, Osaka (JP); Junichi Fukutani, Aichi (JP); Yuichi Watanabe, Gifu (JP); Kazuyori Domoto, Aichi (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 619 days.

(21) Appl. No.: 09/670,692

(22) Filed: Sep. 28, 2000

(30) Foreign Application Priority Data

Oct. 1, 1999 (JP) ............................. 11-281304

(51) Int. Cl.[7] ............................................. H04L 27/08
(52) U.S. Cl. ..................................... 375/345; 455/240.1
(58) Field of Search ................................. 375/345, 316, 375/375, 376; 348/678, 685; 455/240.1, 247.1, 250.1

(56) References Cited

U.S. PATENT DOCUMENTS

| | | | | |
|---|---|---|---|---|
| 4,816,770 A | * | 3/1989 | Naumann | 329/318 |
| 6,049,361 A | * | 4/2000 | Kim | 348/678 |
| 6,070,062 A | * | 5/2000 | Yoshida et al. | 455/234.1 |
| 6,295,017 B1 | * | 9/2001 | Ivanov et al. | 342/17 |
| 6,493,409 B1 | * | 12/2002 | Lin et al. | 375/375 |

* cited by examiner

Primary Examiner—Phoung Phu
(74) Attorney, Agent, or Firm—Wenderoth, Lind & Ponack, L.L.P.

(57) ABSTRACT

A receiver for a digital broadcasting service have a compatibility between tuning to a desired channel at a short period of time and an improve ment of a bit error rate (BER) characteristics. In a case where a target wave is fluctuated, to prevent the receiver from having a significant declination of BER characteristics and to ensure the reproduction of high quality images, the receiver includes an automatic gain controller including a loop filter in which the frequency range of the loop filter can be switched according to an output of a synchronous state discriminator. The frequency band of the loop filter is selectively adjusted to one setting designed for minimizing the duration for tuning a desired channel before a synchronous state is established. After the synchronous state established, the frequency band of the loop filter is switched to another setting designed for enhancing BER characteristics.

7 Claims, 15 Drawing Sheets

DIGITAL BROADCASTING SIGNAL RECEIVER

FIELD OF THE INVENTION

The present invention relates to a receiver for a broadcasting service and particularly to a digital broadcasting signal receiver.

BACKGROUND OF THE INVENTION

As a digital broadcasting service has recently been initiated with a ground wave, a digital modulation technique is required. Such a digital technique of modulating ground wave broadcasting signals commonly consists of superimposing multi-level data over a signal amplitude for increasing the transmission efficiency per unit frequency. In a digital broadcasting receiver, a received digital modified signal is digitally demodulated to a binary signal. It is, however, necessary for improving the quality of the binary signal defined by a bit error rate (BER) to precisely control the amplitude of the digital demodulated signal to a desired level, i.e., carry out automatic gain control.

FIG. 15 illustrates a conventional digital broadcasting signal receiver employing an automatic gain controller. As shown, an RF signal received at an antenna (not shown) is introduced into a mixer 1 where it is combined with an output of a local oscillator 2 to yield an IF signal. A desired frequency band is extracted from the IF signal by a Band Pass Filter (BPF) 3 and transferred to a gain-variable amplifier 4.

The IF signal at mixer 1 is tuned by the frequency of the output of local oscillator 2 so that the IF signal can contain a particular channel signal which is selectively picked up.

The IF signal shaped by variable-gain amplifier 4 is further transferred to a digital signal demodulator 5 where the IF signal is digitally demodulated to generate a binary signal.

Variable-gain amplifier 4 and digital signal demodulator 5 form a feedback control loop together with an automatic gain controller 6 which consists mainly of an automatic gain control device 7, a loop filter 8, and a loop amplifier 9.

Automatic gain control device 7 detects a difference in the amplitude between the IF signal and the desired channel signal from the output of digital signal demodulator 5. The amplitude difference is smoothed by loop filter 8, amplified by loop amplifier 9, and fed back as a control signal to variable-gain amplifier 4 where it controls the signal amplifying rate, thus, to compensate for the amplitude difference in the IF signal.

Meanwhile, it is essential for any digital broadcasting signal receiver to establish the compatibility between quick tuning of a desired channel signal and use of higher BER. The reception of ground wave signals from ground broadcasting stations, unlike the direct transmission of satellite broadcasting signals from satellites, depends largely on the location of an antenna of the digital broadcasting receiver. As the transmission of ground wave signals is commonly disturbed by external obstacles, a received signal may contain static ghosts or Doppler ghosts, hence, declining BER.

In particular, any object located between the transmitter of a broadcasting signal and the antenna of the receiver (for example, the leaves or the branches of trees swayed by winds) may generate an external disturbance known as target wave fluctuation, where the amplitude (intensity of electric field) of a received signal is varied from time to time, hence, significantly declining BER and impairing the reproduction of images. The target wave fluctuation may cause a change of several decibels in the amplitude at intervals of several tens of hertz.

Since the band-width of the loop filter and the gain of the loop amplifier in the automatic gain controller of the conventional digital broadcasting signal receiver are fixed, it is required to increase the band-width of the loop filter and to broaden the control frequency range of the automatic gain controller for tuning a desired channel at a short period of time, thus enhancing the frequency response of the automatic gain controller. Alternatively, the control frequency range can be broadened by increasing the gain in the feedback control circuit. As the gain of the loop amplifier is increased, the control frequency range of the automatic gain controller expands to enhance the frequency response of the automatic gain controller. By enhancing the frequency response of the automatic gain controller, the amplitude of the IF signal introduced to the digital signal demodulator is quickly settled down to a desired range of a level, hence permitting the tuning to a desired broadcasting signal at a shorter period of time.

However, as the control system generally tends to be responsive to a too high frequency range including Doppler ghosts, the amplitude of an input signal to the digital signal demodulator may not stay in the desired range, thus declining the BER characteristics and deteriorating the performance of the digital broadcasting signal receiver.

On the contrary, when the band-width of the loop filer is narrowed to limit the control frequency of the automatic gain controller or the gain of the loop amplifier decreases to limit the control frequency range of the automatic gain controller, a control frequency range of the automatic gain controller becomes smaller than the frequency range of amplitude variation of the IF signal. As a result, the gain controller can hardly respond to any target wave fluctuation particularly with the antenna of the digital broadcasting signal receiver located in a region where the target wave fluctuation occurs frequently. This causes the amplitude of an input signal introduced to the digital signal demodulator not to stay in a desired level, hence declining the BER characteristics, seriously disturbing the production of images, and degrading the performance of the digital broadcasting signal receiver.

SUMMARY OF THE INVENTION

A digital broadcasting signal receiver has a compatibility between the tuning to a desired channel in a short period of time and an improvement of the BER characteristics, and in a case where a target wave fluctuates, prevent significant declination of the BER characteristics and ensure the reproduction of quality images.

The digital broadcasting signal receiver comprises a synchronous state discriminator or an electric field intensity detector for detecting a change in the intensity of an electric field of a received IF signal, so that the frequency range of a loop filter or the gain level of a loop amplifier in an automatic gain controller can be switched according to an output of the synchronous state discriminator or the electric field intensity detector.

The receiver consequently permits the frequency band of the loop filter or the gain level of the loop amplifier in the automatic gain controller to be selectively adjusted to one setting designed for minimizing the duration for tuning a desired channel before the synchronous state is established. Then, after the synchronous state is established, the frequency band of the loop filter or the gain level of the loop amplifier in the automatic gain controller is switched to another setting designed for enhancing the BER characteristics. As a result, the minimum duration for tuning to the desired channel and the higher BER rate will be compatible with each other.

Also, the digital broadcasting signal receiver allows the electric field intensity detector to monitor the amplitude of the intensity of the electric field of the received IF signal. When an amplitude change in the intensity of the electric field and the varying frequency exceed predetermined levels, it is judged that a target wave fluctuation occurs, and the frequency band of the loop filter or the gain level of the loop amplifier in the automatic gain controller is selectively switched. This limits the amplitude of the signal introduced to the digital signal demodulator to a desired range regardless of the occurrence of a target wave fluctuation in the antenna region of the digital broadcasting signal receiver, hence preventing significant declination of the BER characteristics and ensuring the reproduction of high quality images.

DETAILED DESCRIPTION OF THE PREFERRED EMBODIMENTS

Some embodiments of the present invention will be described referring to the relevant drawings.

Embodiment 1

Figure 1:
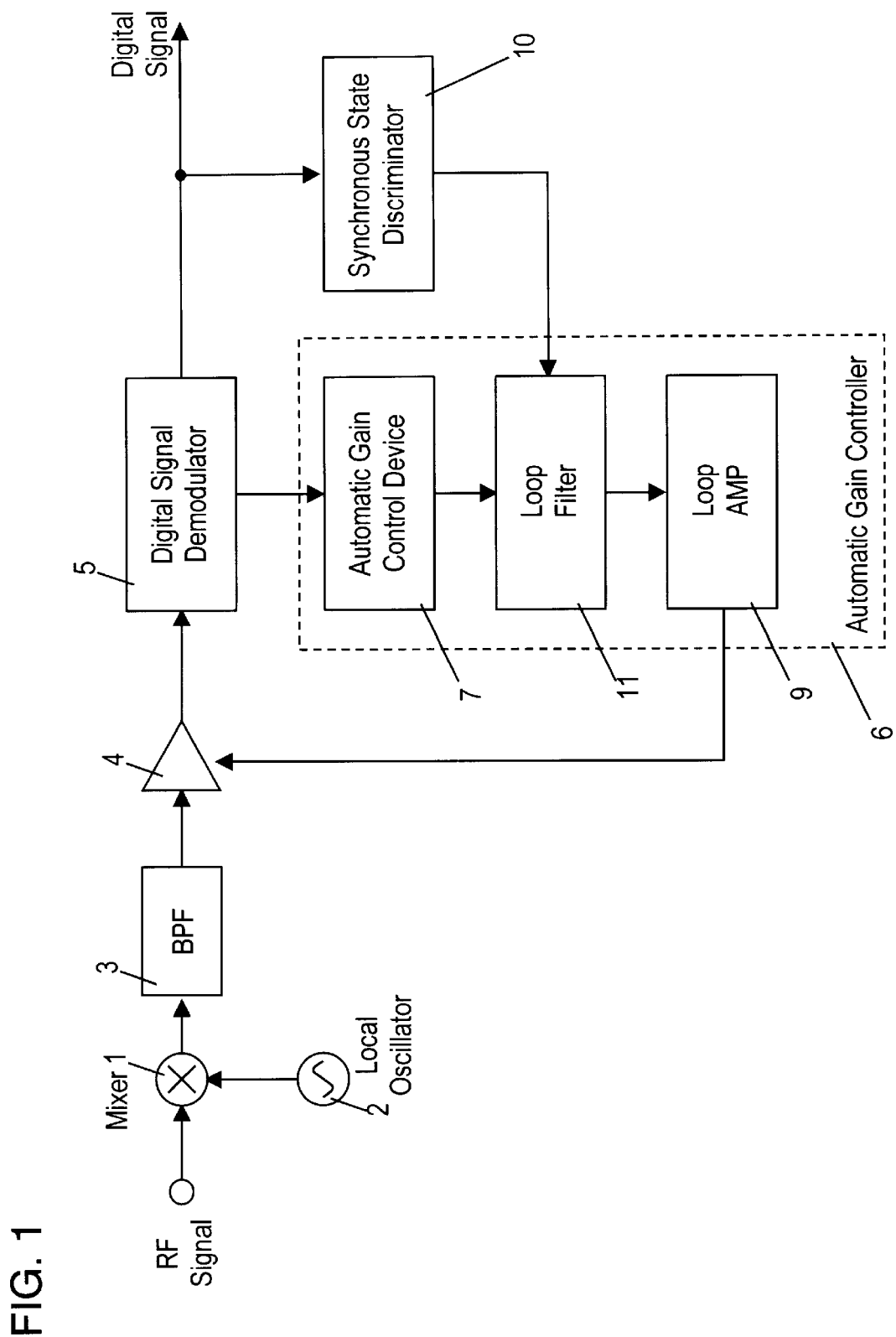
FIG. 1 is a block diagram of a circuit of a digital broadcasting signal receiver showing embodiment 1 of the present invention.
Figure 15:
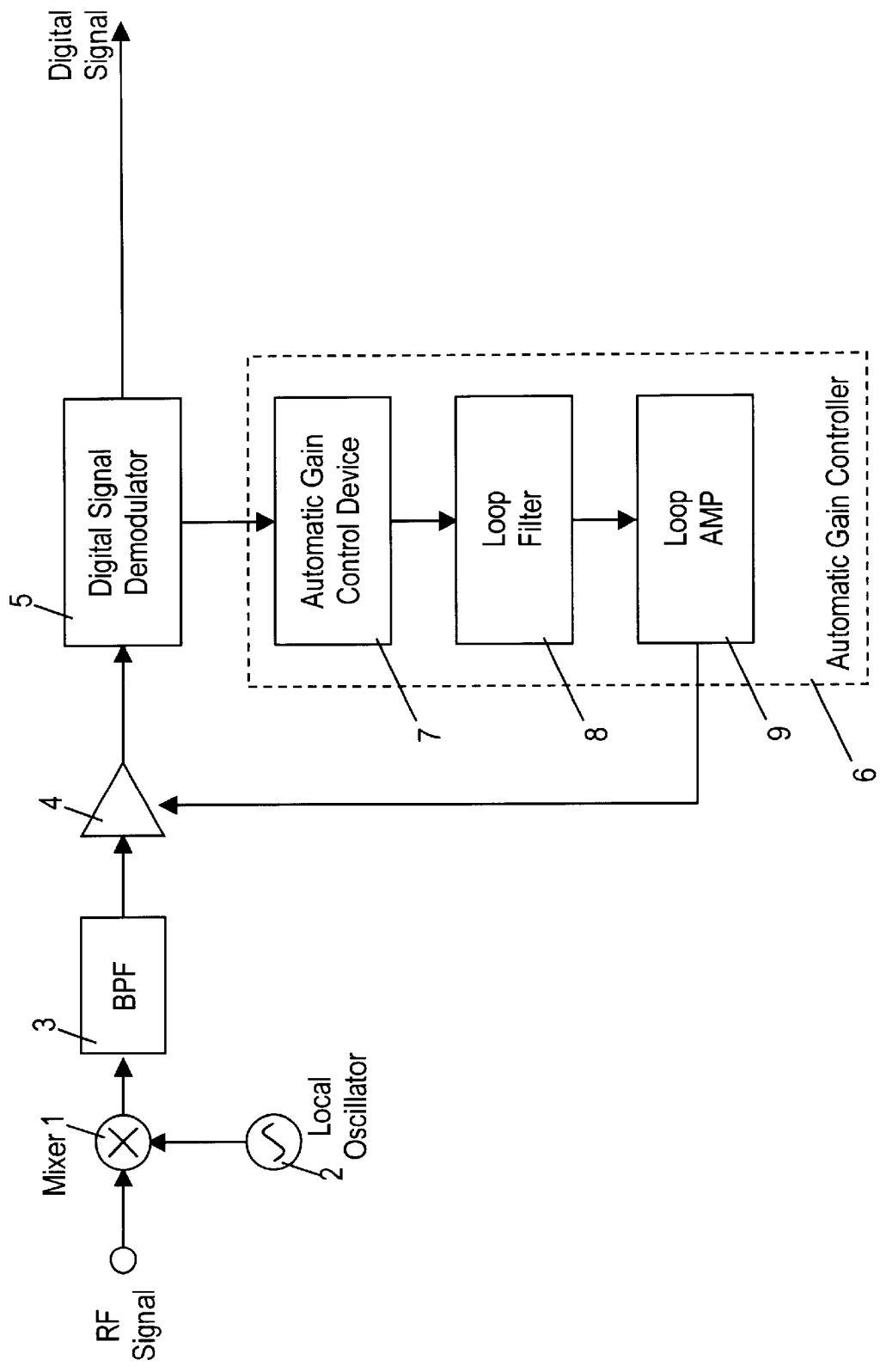
FIG. 15 a block diagram of a circuit of a conventional digital broadcasting signal receiver.

FIG. 1 is a block diagram of a circuit of a digital broadcasting signal receiver showing embodiment 1 of the present invention. As the digital broadcasting signal receiver of this embodiment is fundamentally identical in the arrangement to the conventional digital broadcasting signal receiver shown in FIG. 15, like components are denoted by like numerals and will not be explained in detail.

As shown, automatic gain controller 6 which comprises automatic gain control device 7, a loop filter 11, and loop amplifier 9 constitutes a feedback control loop together with variable-gain amplifier 4 and digital signal demodulator 5.

A synchronous state discriminator 10 is provided for extracting a predetermined pattern of data from a digital signal released from digital signal demodulator 5. When the data pattern fails to be extracted, the signal is found to be in a non-synchronous state. When the data pattern is successfully extracted, the signal is in a synchronous state.

The output of synchronous state discriminator 10 is thus a signal indicative of either the synchronous state or the non-synchronous state which is then transferred to loop filter 11. Loop filter 11 has two different ranges of frequencies and in response to the output of synchronous state discriminator 10, switches from one frequency range to the other. In a case of the non-synchronous state, one frequency range designed for minimizing the duration of tuning to a desired broadcasting signal is selected. When the synchronous state is acknowledged, the other frequency range designed for improving the BER characteristics of a received signal is selectively used.

For tuning to a desired channel, the frequency of an output of local oscillator 2 is determined so that an IF signal released from mixer 1 contains the desired channel. Similarly, fortuning to another channel after the synchronous state is acknowledged, the frequency of an output of local oscillator 2 is set so that the IF signal released from mixer 1 contains the another channel. At this time, as the synchronous state is eliminated, the output of synchronous state discriminator 10 indicates the non-synchronous state.

Embodiment 2

Figure 2:
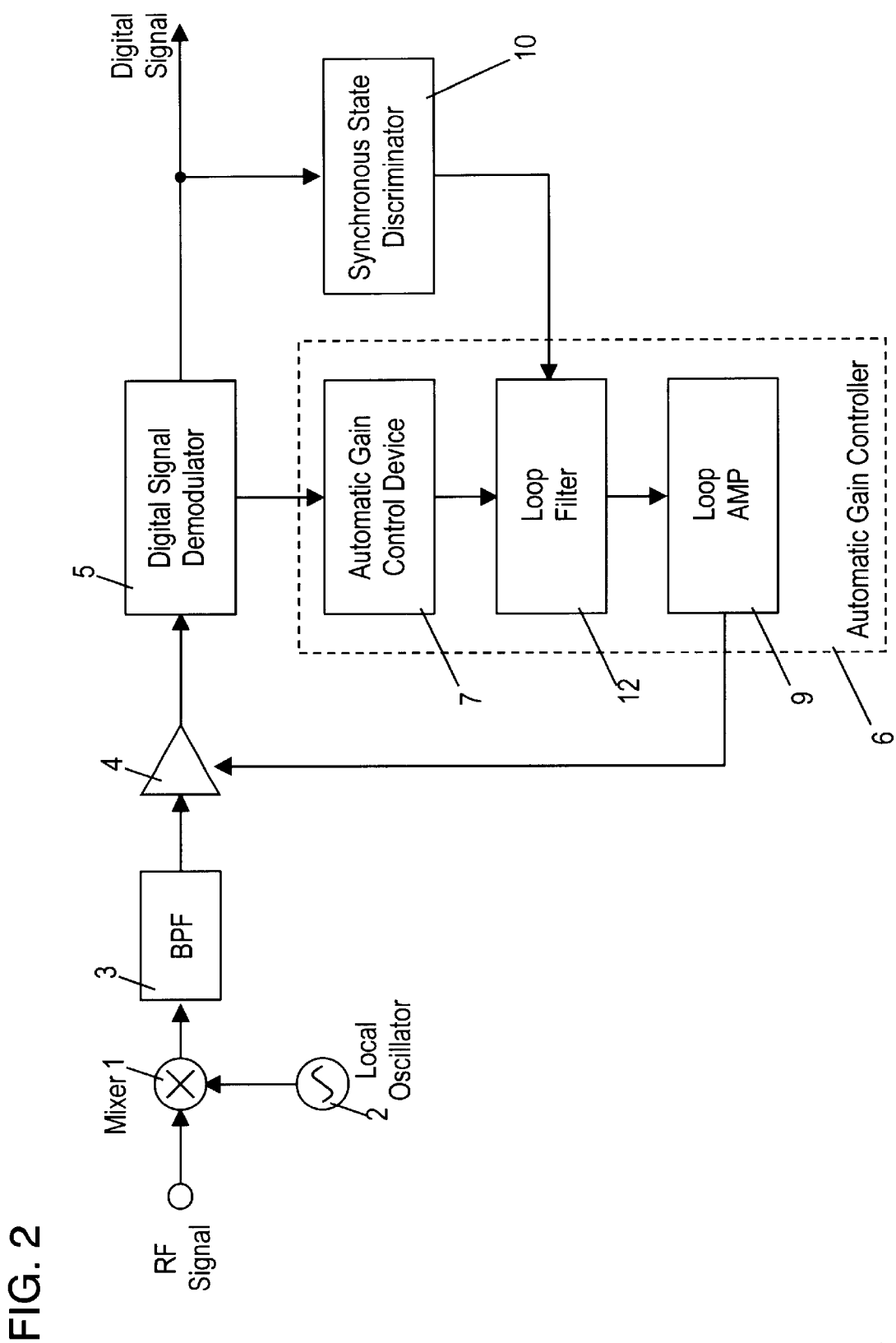
FIG. 2 is a block diagram of a circuit of a digital broadcasting signal receiver showing embodiment 2 of the present invention.

FIG. 2 is a block diagram of a circuit of a digital broadcasting signal receiver showing embodiment 2 of the present invention. As the digital broadcasting signal receiver of this embodiment is fundamentally identical in that of embodiment 1 shown in FIG. 1, like components are denoted by like numerals and will not be explained in detail.

As shown, automatic gain controller 6 which comprises automatic gain control device 7, a loop filter 12, and loop amplifier 9 constitutes a feedback control loop together with variable-gain amplifier 4 and digital signal demodulator 5.

Loop filter 12 has two, wide and narrow, ranges of frequencies and switches from one to the other in response to the output of synchronous state discriminator 10. In a case of the non-synchronous state, the wide range of frequencies is selectively used to enhance the frequency response of the control loop. This allows the amplitude of an IF signal introduced to digital signal demodulator 5 to be quickly settled down in a desired range, thus minimizing the duration required for tuning the desired channel. When the synchronous state is acknowledged, the filter frequency is switched to the narrow range, hence making the controlling action over the IF signal amplitude of automatic gain controller 6 less susceptible to Doppler ghosts and improving the BER characteristics.

Embodiment 3

Figure 3:
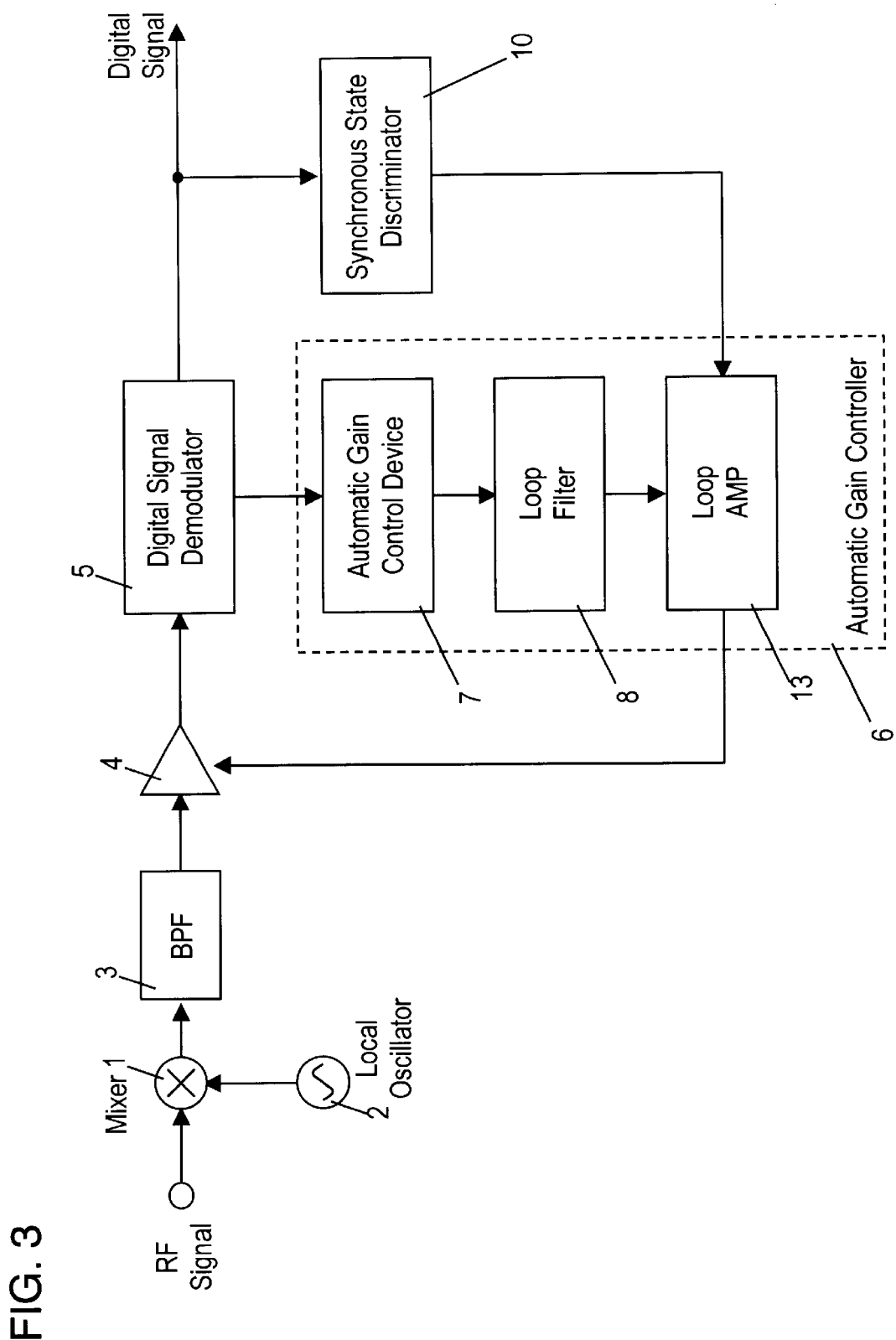
FIG. 3 is a block diagram of a circuit of a digital broadcasting signal receiver showing embodiment 3 of the present invention.

FIG. 3 is a block diagram of a circuit of a digital broadcasting signal receiver showing embodiment 3 of the present invention.

As shown, automatic gain controller 6 which comprises automatic gain control device 7, loop filter 8, and a loop amplifier 13 constitute a feedback control loop together with variable-gain amplifier 4 and digital signal demodulator 5.

Loop amplifier 13 has two different gain levels which are switched from one to the other in response to the output of synchronous state discriminator 10. When the non-synchronous state is acknowledged, one gain level designed for minimizing the duration required for tuning to the desired channel is selected. In a case of the synchronous state, the other gain level designed for improving the BER characteristics of the received signal is selectively used.

Embodiment 4

Figure 4:
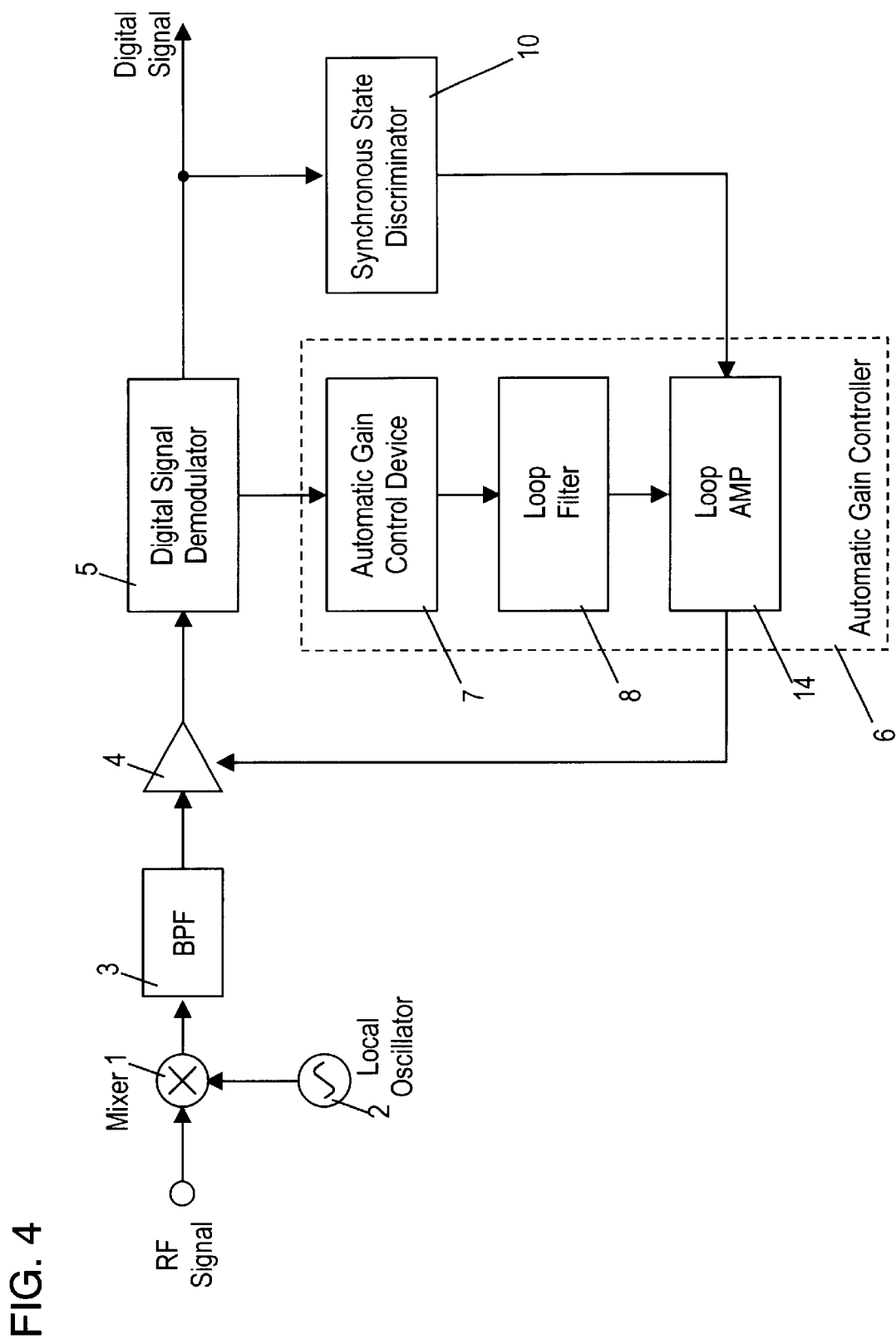
FIG. 4 is a block diagram of a circuit of a digital broadcasting signal receiver showing embodiment 4 of the present invention.

FIG. 4 is a block diagram of a circuit of a digital broadcasting signal receiver showing embodiment 4 of the present invention.

As shown, automatic gain controller 6 which comprises automatic gain control device 7, loop filter 8, and a loop amplifier 14 constitute a feedback control loop together with variable-gain amplifier 4 and digital signal demodulator 5.

Loop amplifier 14 has two, large and small, gain levels which are switched from one to the other in response to the output of synchronous state discriminator 10. When the non-synchronous state is acknowledged, the large gain level is selected. The larger the gain, the wider the control frequency range of the feedback control system is broadened. As the gain of loop amplifier 14 is increased to broaden the control frequency of automatic gain controller 6 and to enhance the frequency response of the control loop of the automatic gain controller 6, the amplitude of an IF signal introduced to digital signal demodulator 5 can quickly be settled down in a desired range, hence minimizing the duration required for tuning to the desired channel. In a case of the synchronous state, loop amplifier 14 is switched to the small gain level. The smaller the gain, the narrower the control frequency range becomes in the feedback control system. As loop amplifier 14 is switched to the small gain to limit the control frequency range of automatic gain controller 6, the controlling action over the IF signal amplitude of automatic gain controller 6 can be less susceptible to Doppler ghosts, hence improving the BER characteristics.

Embodiment 5

Figure 5:
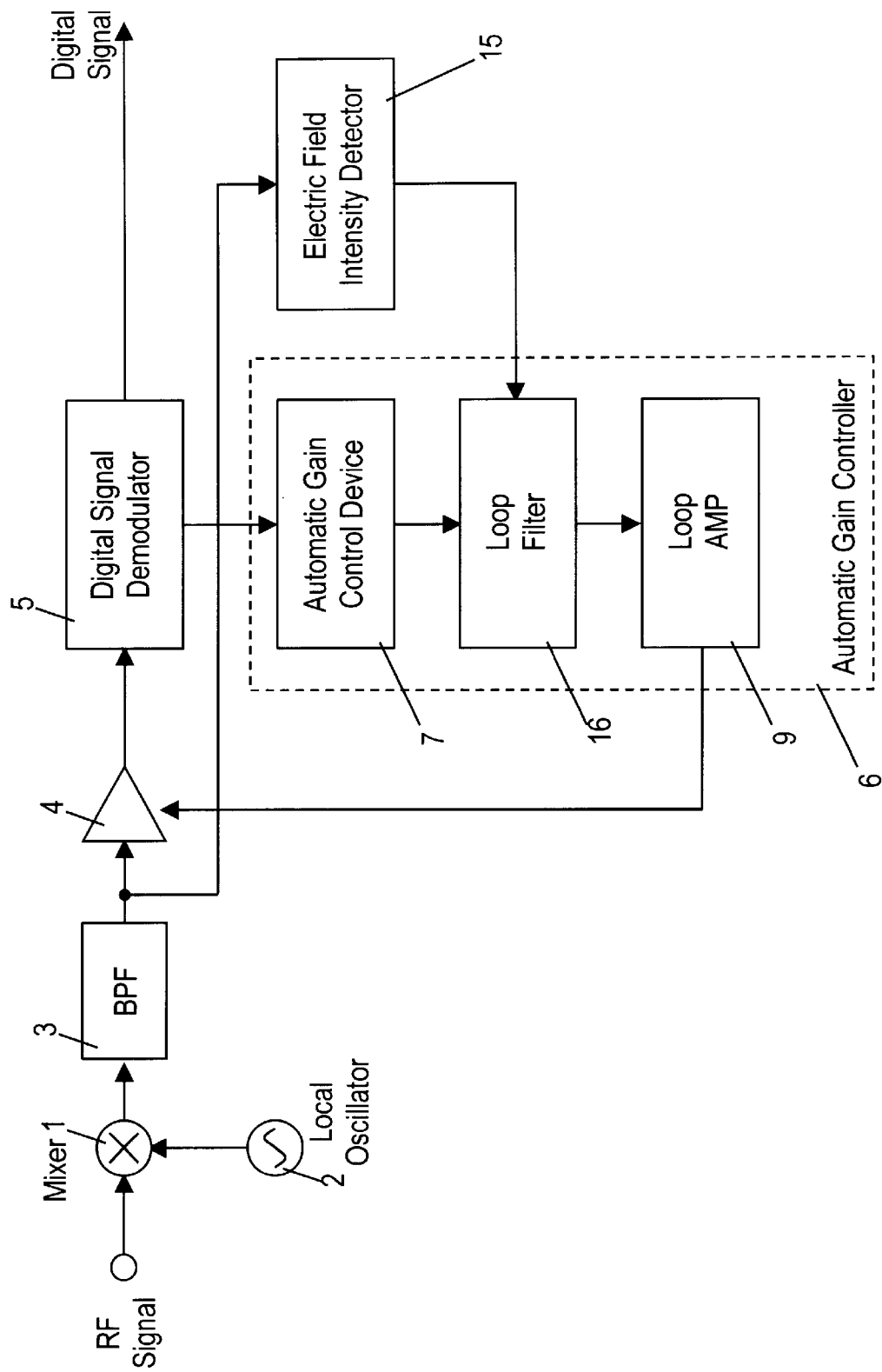
FIG. 5 is a block diagram of a circuit of a digital broadcasting signal receiver showing embodiment 5 of the present invention.

FIG. 5 is a block diagram of a circuit of a digital broadcasting signal receiver showing embodiment 5 of the present invention.

As shown, automatic gain controller 6 which comprises automatic gain control device 7, a loop filter 16, and loop amplifier 9 constitute a feedback control loop together with variable-gain amplifier 4 and digital signal demodulator 5.

After the desired channel is tuned, an electric field intensity detector 15 monitors a change with time in the intensity of an electric field and examines whether or not the varying frequency and the amplitude change in the electric field intensity exceed predetermined levels to find the occurrence of target wave fluctuation. The output of electric field intensity detector 15 is a signal indicating whether or not a target wave fluctuation occurs. In response to the output of electric field intensity detector 15, loop filter 16 having two different frequency ranges can switch the frequency band from one to the other. When it is discriminated by electric field intensity detector 15 that a target wave fluctuation presumably occurs, loop filter 16 selects one frequency range designed for accepting the varying frequency due to the target wave fluctuation to set the amplitude of the input signal of digital signal demodulator 5 to a desired range, hence avoiding declination of the BER characteristics.

Embodiment 6

Figure 6:
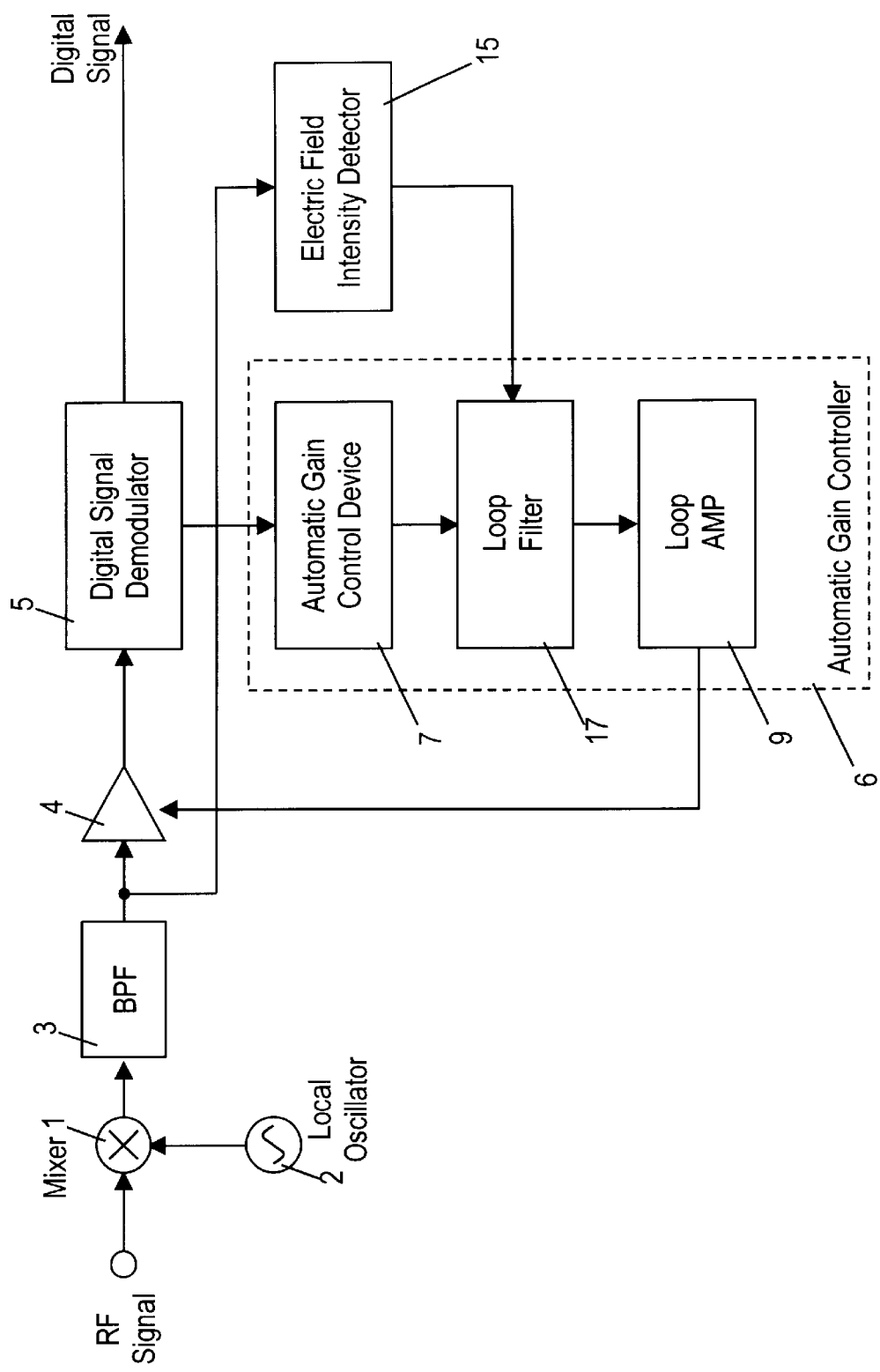
FIG. 6 is a block diagram of a circuit of a digital broadcasting signal receiver showing embodiment 6 of the present invention.

FIG. 6 is a block diagram of a circuit of a digital broadcasting signal receiver showing embodiment 6 of the present invention.

As shown, automatic gain controller 6 which comprises automatic gain control device 7, a loop filter 17, and loop amplifier 9 constitute a feedback control loop together with variable-gain amplifier 4 and digital signal demodulator 5.

Loop filter 17 has two, wide and narrow, frequency ranges which are switched from one to the other in response to the output of electric field intensity detector 15. When the desired channel has been tuned and electric field intensity detector 15 discriminated that a target wave fluctuation presumably occurs, loop filter 17 selects the wide frequency range to enhance the frequency response of the control loop. This allows automatic gain controller 6 to accept the varying frequency due to the target wave fluctuation and set the amplitude of the input signal of digital signal demodulator 5 to a desired range, hence avoiding declination of the BER characteristics.

Embodiment 7

Figure 7:
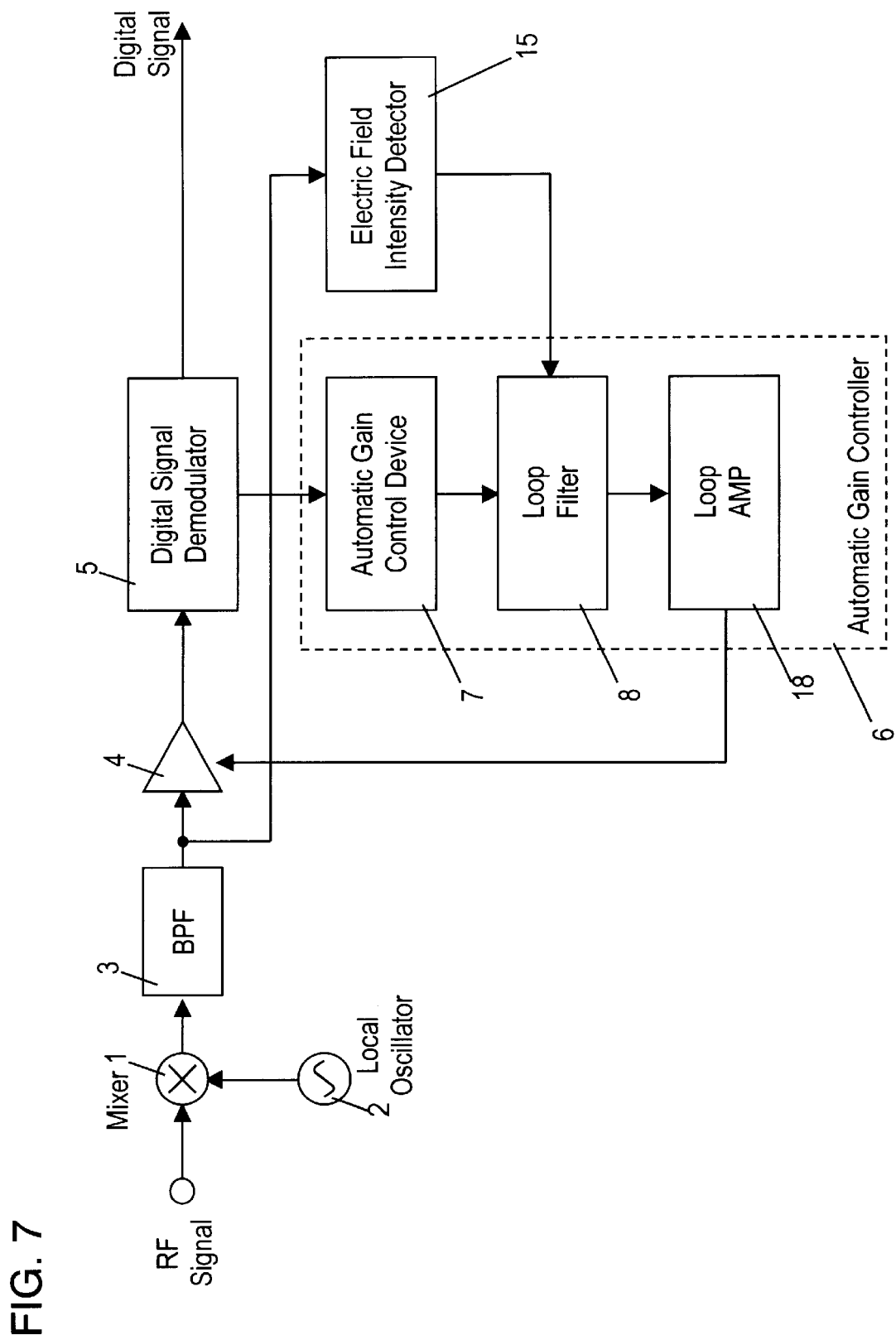
FIG. 7 is a block diagram of a circuit of a digital broadcasting signal receiver showing embodiment 7 of the present invention.

FIG. 7 is a block diagram of a circuit of a digital broadcasting signal receiver showing embodiment 7 of the present invention.

As shown, automatic gain controller 6 which comprises automatic gain control device 7, loop filter 8, and a loop amplifier 18 constitute a feedback control loop together with variable-gain amplifier 4 and digital signal demodulator 5.

Loop amplifier 18 has two gain levels which are switched from one to the other in response to the output of electric field intensity detector 15. When the desired channel has been tuned and electric field intensity detector 15 discriminated that a target wave fluctuation presumably occurs, loop amplifier 18 selects the gain level designed for accepting the varying frequency due to the target wave fluctuation. This allows automatic gain controller 6 to accept the varying frequency due to the target wave fluctuation and set the amplitude of the input signal of digital signal demodulator 5 to a desired range, hence avoiding declination of the BER characteristics.

Embodiment 8

Figure 8:
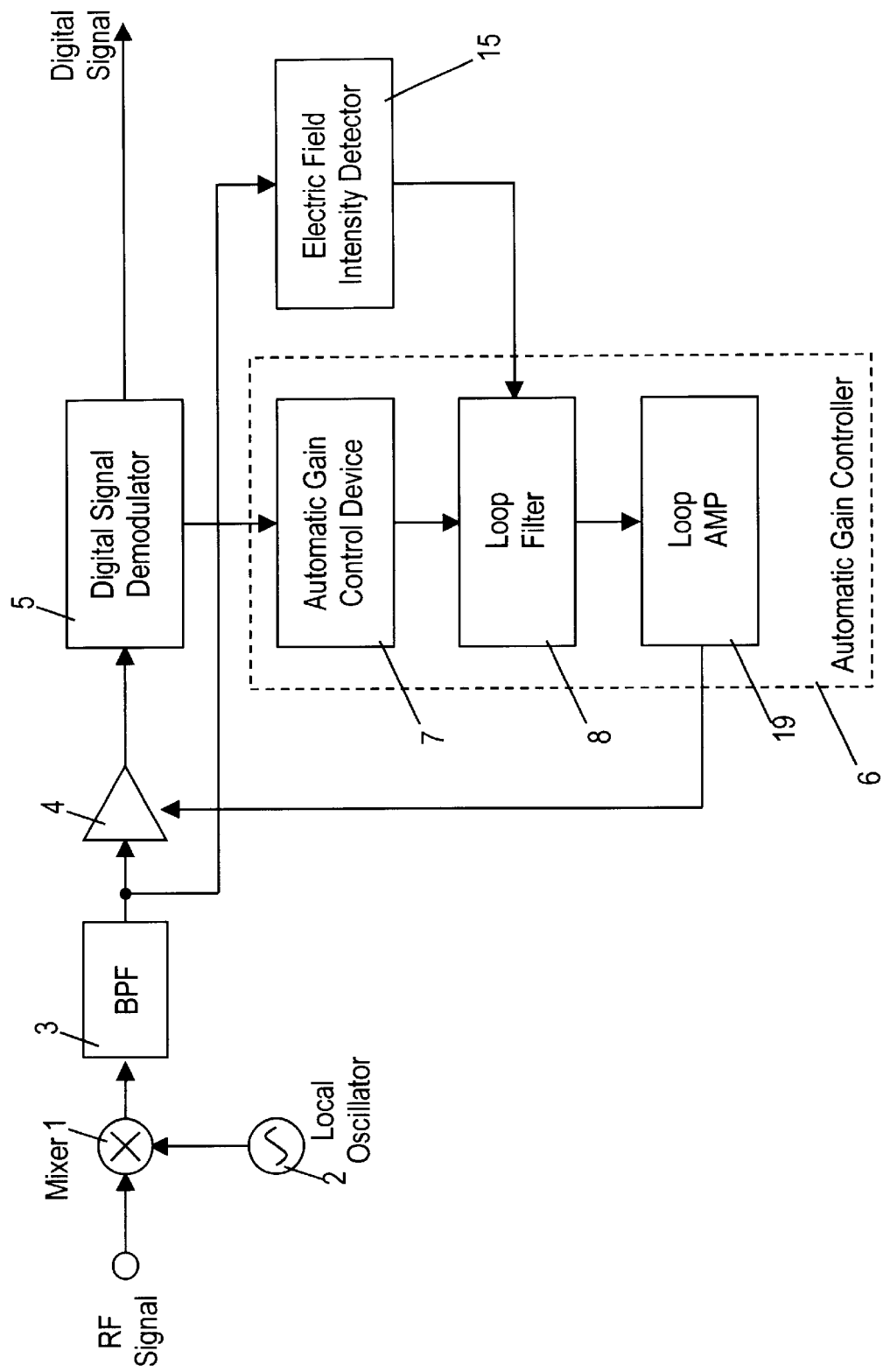
FIG. 8 is a block diagram of a circuit of a digital broadcasting signal receiver showing embodiment 8 of the present invention.

FIG. 8 is a block diagram of a circuit of a digital broadcasting signal receiver showing embodiment 8 of the present invention.

As shown, automatic gain controller 6 which comprises automatic gain control device 7, loop filter 8, and a loop amplifier 19 constitute a feedback control loop together with variable-gain amplifier 4 and digital signal demodulator 5.

Loop amplifier 19 has two, large and small, gain levels which are switched from one to the other in response to the output of electric field intensity detector 15. When the desired channel has been tuned and electric field intensity detector 15 discriminated that a target wave fluctuation presumably occurs, loop amplifier 19 selects the large gain level. The larger the gain, the wider the control frequency of the feedback control system is given. As the gain of loop amplifier 19 is increased, the control frequency of automatic gain controller 6 is broadened. Accordingly, the frequency response of the control loop of automatic gain controller 6 is enhanced. This allows automatic gain controller 6 to accept the varying frequency due to the target wave fluctuation and set the amplitude of the input signal of digital signal demodulator 5 to a desired range, hence avoiding declination of the BER characteristics.

Embodiment 9

Figure 9:
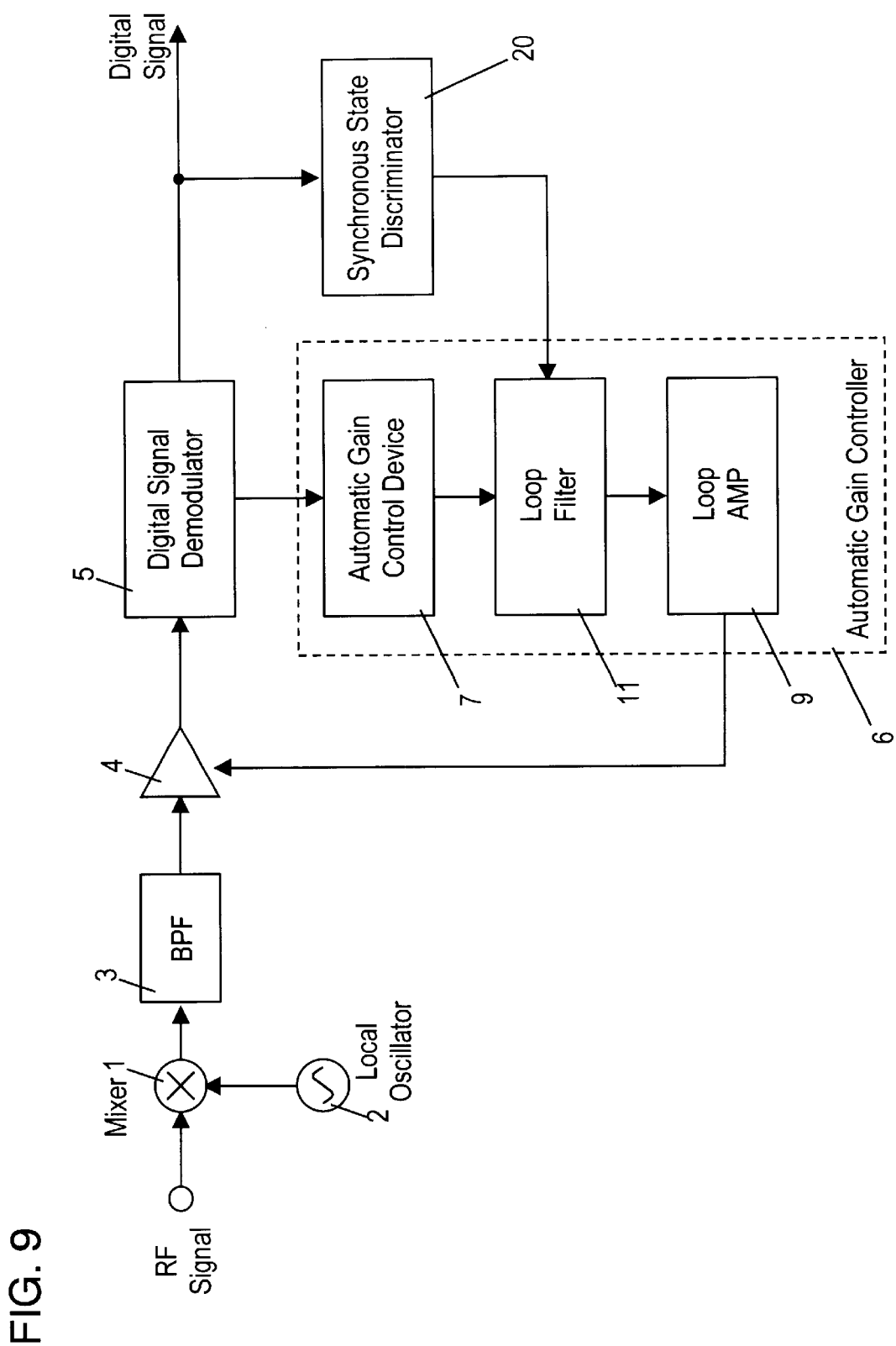
FIG. 9 is a block diagram of a circuit of a digital broadcasting signal receiver showing embodiment 9 of the present invention.

FIG. 9 is a block. diagram of a circuit of a digital broadcasting signal receiver showing embodiment 9 of the present invention. The digital broadcasting signal receiver of this embodiment is fundamentally identical in arrangement to those shown in FIG. 1, 2, 3, or 4.

Figure 10:
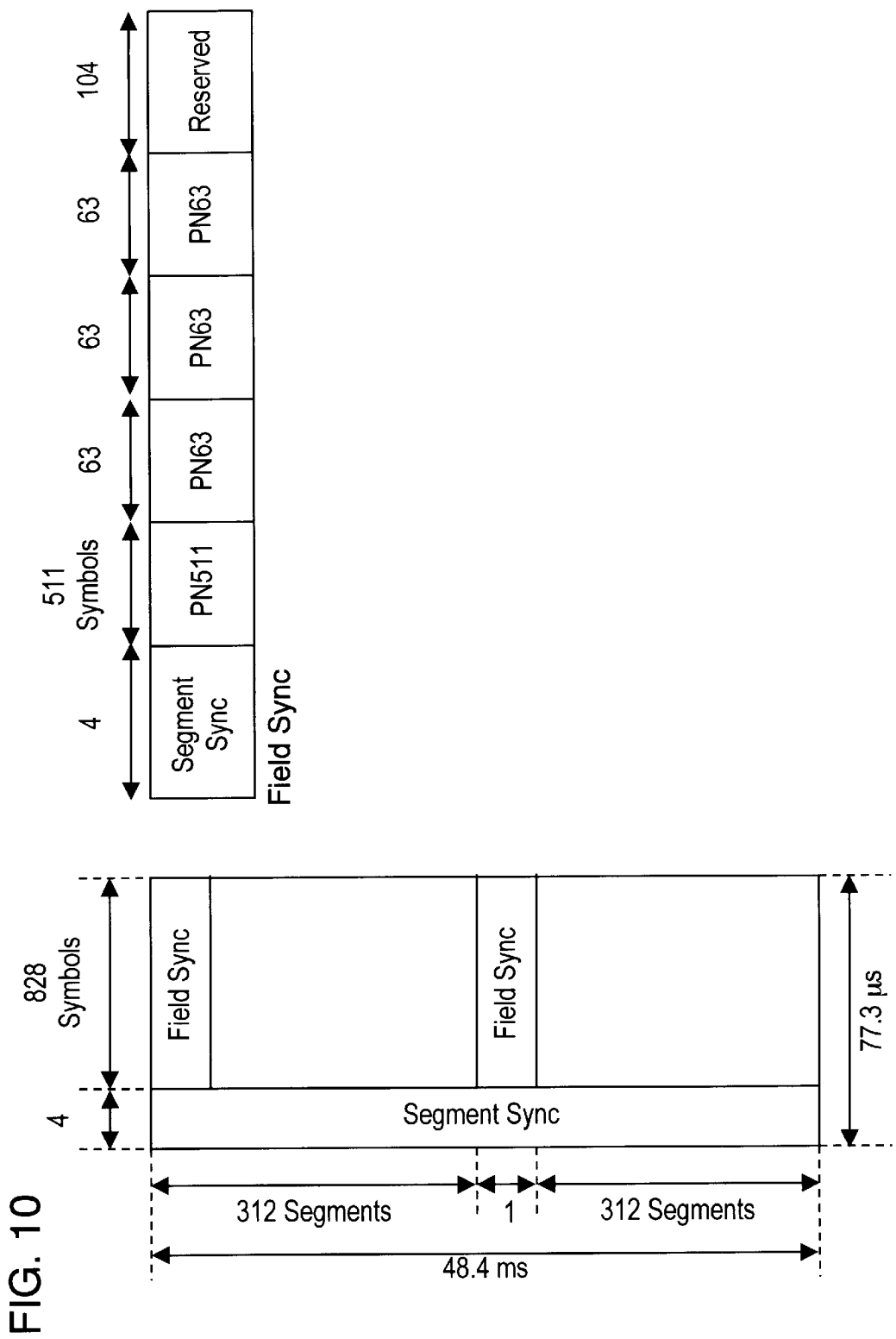
FIG. 10 is a diagram of a transmission format of the North American ATSC system.

FIG. 10 illustrates a transmission format of the North American ATSC system, where each segment has a period of 77.3 microseconds and 313 of the segments form one field. The segment comprises 832 symbols and the first four symbols constitute a segment SYNC which indicates the front end of the segment.

The first segment of each field is a pseudo random signal (PN511, PN63), a field SYNC, for indicating the front end of the field. Synchronous state discriminator 20 is provided for, when detecting the segment SYNC or both the segment SYNC and the field SYNC from the digital signal output of digital signal demodulator 5, discriminating that the signal is at the synchronous state and switching the control loop property of automatic gain controller. 6.

Embodiment 10

Figure 11:
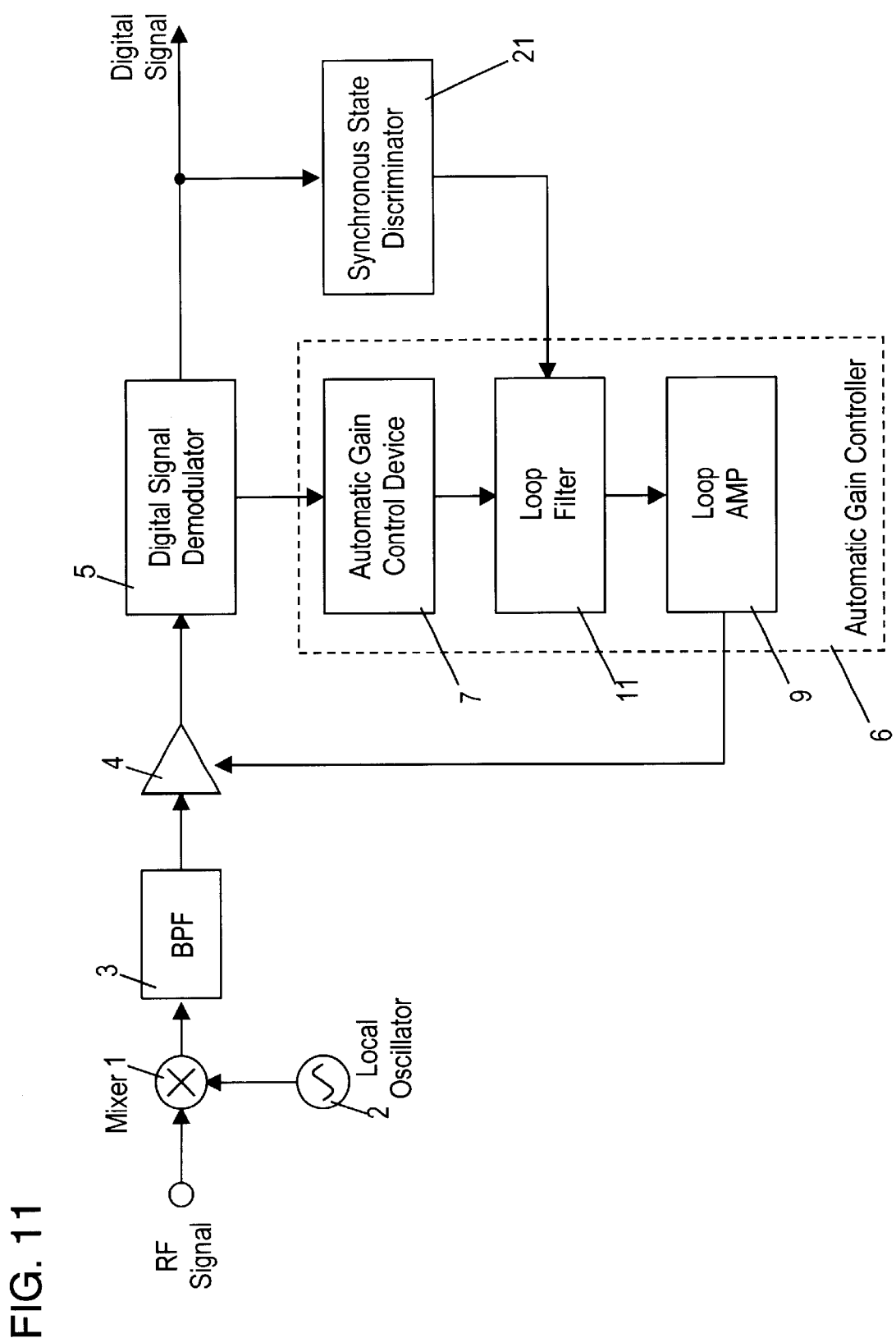
FIG. 11 is a block diagram of a circuit of a digital broadcasting signal receiver showing embodiment 10 of the present invention.

FIG. 11 is a block diagram of a circuit of a digital broadcasting signal receiver showing embodiment 10 of the present invention. The digital broadcasting signal receiver of this embodiment is fundamentally identical in arrangement to those shown in FIG. 1, 2, 3, or 4.

Figure 12:
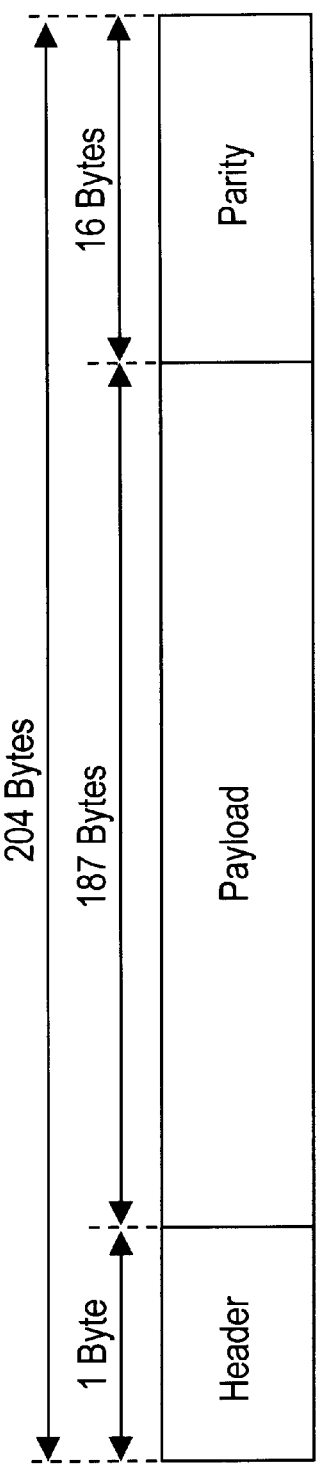
FIG. 12 is a diagram of a transmission format of the European DVB-T system.

FIG. 12 illustrates a transmission format of the European DVB-T system having a packet structure where "payload" of a transport packet stream specified by MPEG2-SYSTEMS (ISO/IEC13818-1) is joined with a 16-byte parity used for error correction, totaling 204 bytes. One byte at the front end of the packet is a header acting as frame SYNC used for detection of the packet. Asynchronous state discriminator 21 is provided for, when detecting the frame SYNC from the digital signal output of digital signal demodulator 5, discriminating that the signal is in the synchronous state and switching the control loop property of automatic gain controller 6.

Embodiment 11

Figure 13:
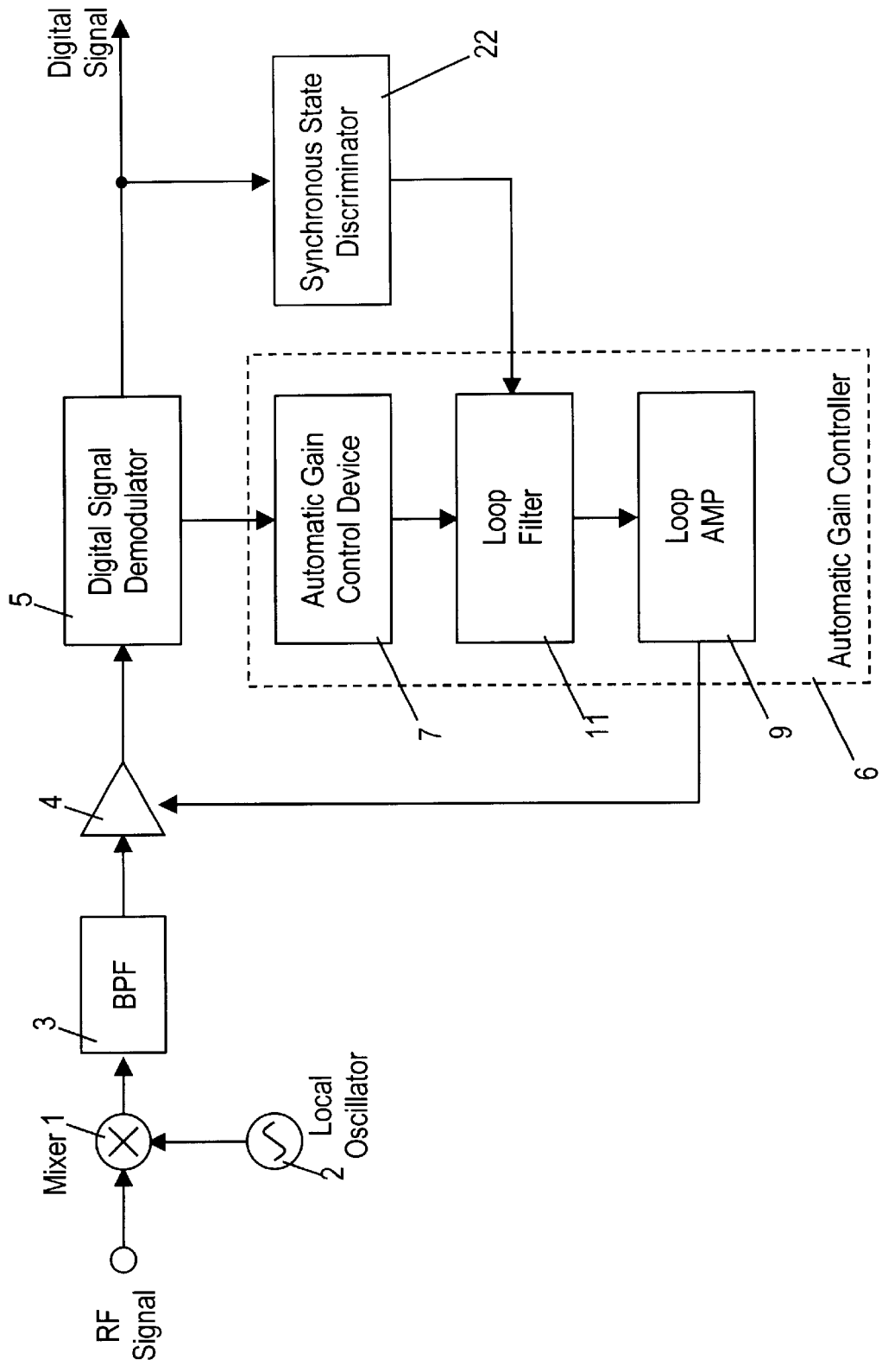
FIG. 13 is a block diagram of a circuit of a digital broadcasting signal receiver showing embodiment 11 of the present invention.

FIG. 13 is a block diagram of a circuit of a digital broadcasting signal receiver showing embodiment 11 of the present invention. The digital broadcasting signal receiver of this embodiment is fundamentally identical in arrangement to that shown in FIG. 11.

Figure 14:
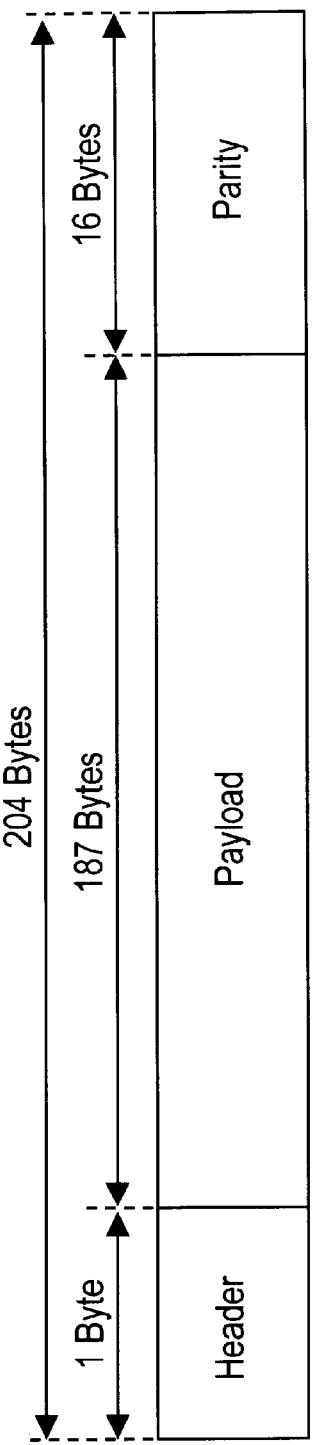
FIG. 14 is a diagram of a transmission format of the Japanese ISDB-T system.

FIG. 14 illustrates a transmission format of the Japanese ISDB-T system having a packet structure where "payload" of a transport packet stream specified by MPEG2-SYSTEMS (ISO/IEC13818-1) is joined with a 16-byte parity used for error correction, totaling 204 bytes. One byte at the front end of the packet is a header acting as frame SYNC used for detection of the packet. Asynchronous state discriminator 22 is provided for, when detecting the frame SYNC from the digital signal output of digital signal demodulator 5, discriminating that the signal is in the synchronous state and switching the control loop property of automatic gain controller 6.

As set forth above, the present invention includes a synchronous state discriminator or an electric field intensity detector for detection of a change in the intensity of the electric field of the received IF signal, allowing the frequency band of a loop filter or the gain level of a loop amplifier in the automatic gain controller to be switched in response to the output of either the synchronous state discriminator or the electric field intensity detector.

Consequently, while the frequency band of the loop filter or the gain level of the loop amplifier in the automatic gain controller is selectively adjusted to one setting designed for minimizing the duration required for tuning a desired channel before the synchronous state is established, it can be switched, after the synchronous state established, to another setting designed for enhancing the BER characteristics. As a result, the minimum duration for tuning the desired channel and higher BER will be compatible with each other.

Also, when the amplitude of the intensity of an electric field of the received IF signal is being monitored with time by the electric field intensity detector and a change in the amplitude and the varying frequency exceed predetermined levels, it is discriminated that a target wave fluctuation occurs and the frequency band of the loop filter or the gain level of the loop amplifier in the automatic gain controller is selectively switched from one setting to the other. This prevents a decline of the BER characteristics, even if the target wave fluctuation occurs, hence ensuring the reproduction of high quality images.

What is claimed is:

1. A digital signal receiver for receiving a digital signal, said digital signal receiver comprising:
   a digital signal demodulator for demodulating a digital modulated signal to retrieve digital signal data;
   a synchronous state discriminator for extracting a predetermined pattern of data from the digital signal data retrieved from said digital signal demodulator; and
   an automatic gain controller including a loop filter and a loop amplifier,
   wherein a frequency range of said loop filter is switched between a non-synchronous state indicating that the predetermined pattern is not extracted by said synchronous state discriminator and a synchronous state indicating that the predetermined pattern is extracted by said synchronous state discriminator, and
   wherein when an output of said synchronous state discriminator shifts from the non-synchronous state to the synchronous state, the frequency range of said loop filter is switched to a narrower setting.

2. The digital signal receiver according to claim 1, wherein when the output of said synchronous state discriminator shifts from the non-synchronous state to the synchronous state, a gain level of said loop amplifier is switched to a smaller setting.

3. A digital signal receiver for receiving a digital signal, said digital signal receiver comprising:
   a gain-variable amplifier operable to amplify a received IF signal inputted thereto;
   a demodulator for demodulating a digital modulated signal from an output of said gain-variable amplifier;

an electric field intensity detector for detecting an amplitude change of an electric field of the received IF signal and a speed of the amplitude change; and an automatic gain controller including a loop filter and a loop amplifier, said automatic gain controller being operable to control a gain of said gain-variable amplifier according to an amplitude of the output of said gain-variable amplifier, wherein when at least one of the amplitude change and the speed of the amplitude change exceeds a setting level, the frequency band of said loop filter is switched to a wider setting.

4. A digital signal receiver comprising:

a gain-variable amplifier operable to amplify a received IF signal inputted thereto;

a demodulator for demodulating a digital modulated signal from an output of said gain-variable amplifier;

an electric field intensity detector for detecting an amplitude change of an electric field of the received IF signal and a speed of the amplitude change; and an automatic gain controller including a loop filter and a loop amplifier, said automatic gain controller being operable to control a gain of said gain-variable amplifier according to an amplitude of the output of the gain-variable amplifier, wherein when at least one of the amplitude change and the speed of the amplitude change exceeds a setting level, the gain level of said loop amplifier is switched to a larger setting.

5. A digital signal receiver for receiving a digital signal, said digital signal receiver comprising:

a digital signal demodulator for demodulating a digital modulated signal to retrieve digital signal data;

a synchronous state discriminator for extracting a predetermined pattern of data from the digital signal data retreived from said digital signal demodulator; and an automatic gain controller including a loop filter and a loop amplifier, wherein a frequency range of said loop filter is switched between a non-synchronous state indicating that the predetermined pattern is not extracted by said synchronous state discriminator and a synchronous state indicating that the predetermined pattern is extracted by said synchronous state discriminator, and wherein the digital signal is of a North American ATSC system, and the predetermined pattern is in at least one of a frame sync signal, a field sync signal, and a segment sync signal.

6. A digital signal receiver for receiving a digital signal, said digital signal receiver comprising:

a digital signal demodulator for demodulating a digital modulated signal to retrieve digital signal data;

a synchronous state discriminator for extracting a predetermined pattern of data from the digital signal data retrieved from said digital signal demodulator; and an automatic gain controller including a loop filter and a loop amplifier, wherein a frequency range of said loop filter is switched between a non-synchronous state indicating that the predetermined pattern is not extracted by said synchronous state discriminator and a synchronous state indicating that the predetermined pattern is extracted by said synchronous state discriminator, and wherein the digital signal is of a European DVB-T system, and the predetermined pattern is in a frame sync signal.

7. A digital signal receiver for receiving a digital signal, said digital signal receiver comprising:

a digital signal demodulator for demodulating a digital modulated signal to retrieve digital signal data;

a synchronous state discriminator for extracting a predetermined pattern of data from the digital signal data retrieved from said digital signal demodulator; and an automatic gain controller including a loop filter and a loop amplifier, wherein a frequency range of said loop filter is switched between a non-synchronous state indicating that the predetermined pattern is not extracted by said synchronous state discriminator and a synchronous state indicating that the predetermined pattern is extracted by said synchronous state discriminator, and wherein the digital signal is of a Japanese ground wave system, and the predetermined pattern is in at least one of a frame sync signal and a symbol sync signal.

* * * * *

UNITED STATES PATENT AND TRADEMARK OFFICE
CERTIFICATE OF CORRECTION

PATENT NO.   : 6,744,830 B1
DATED        : June 1, 2004
INVENTOR(S)  : Hitonobu Furukawa et al.

It is certified that error appears in the above-identified patent and that said Letters Patent is hereby corrected as shown below:

Title page,
Item [57], ABSTRACT,
Line 3, please change "improve ment" to -- improvement --.

Signed and Sealed this

Seventeenth Day of August, 2004

JON W. DUDAS
*Acting Director of the United States Patent and Trademark Office*